United States Patent
Lee et al.

(10) Patent No.: US 8,940,408 B2
(45) Date of Patent: Jan. 27, 2015

(54) WHITE ORGANIC LIGHT-EMITTING DEVICE

(75) Inventors: Meng-Ting Lee, Hsinchu (TW); Miao-Tsai Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1090 days.

(21) Appl. No.: 12/574,265

(22) Filed: Oct. 6, 2009

(65) Prior Publication Data

US 2010/0314612 A1  Dec. 16, 2010

(30) Foreign Application Priority Data

Jun. 11, 2009  (TW) .............................. 98119495 A

(51) Int. Cl.
- *H01L 51/10* (2006.01)
- *H01L 33/00* (2010.01)
- *H01L 51/50* (2006.01)
- *H01L 51/00* (2006.01)

(52) U.S. Cl.
CPC ......... *H01L 51/5036* (2013.01); *H01L 51/0061* (2013.01); *H01L 51/0074* (2013.01); *H01L 51/0085* (2013.01)
USPC .............................. 428/690; 257/40; 257/98

(58) Field of Classification Search
None
See application file for complete search history.

(56) References Cited

U.S. PATENT DOCUMENTS

| | | | |
|---|---|---|---|
| 2006/0083944 A1* | 4/2006 | Igarashi et al. | 428/690 |
| 2006/0134462 A1* | 6/2006 | Yeh et al. | 428/690 |
| 2007/0035240 A1 | 2/2007 | Yang et al. | |
| 2007/0188083 A1* | 8/2007 | Iwakuma et al. | 313/506 |
| 2007/0228938 A1* | 10/2007 | Hatwar et al. | 313/504 |
| 2007/0278936 A1* | 12/2007 | Herron et al. | 313/504 |
| 2008/0233431 A1* | 9/2008 | Oshiyama et al. | 428/690 |
| 2008/0286610 A1 | 11/2008 | Deaton et al. | |

FOREIGN PATENT DOCUMENTS

| | | |
|---|---|---|
| CN | 1610468 A | 4/2005 |
| JP | 2007189002 | 7/2007 |
| JP | 2007335214 | 12/2007 |
| TW | I279165 | 4/2007 |

OTHER PUBLICATIONS

Machine English translation of JP 2007-335214 A. Aug. 24, 2012.*

* cited by examiner

*Primary Examiner* — J. L. Yang
(74) *Attorney, Agent, or Firm* — Muncy, Geissler, Olds & Lowe, P.C.

(57) ABSTRACT

A white organic light-emitting device is provided by the present invention. The white organic light-emitting device includes an anode, a hole transport layer, a first light-emitting layer, a second light-emitting layer, a third light-emitting layer, an electron transport layer and a cathode, wherein the second light-emitting layer is formed between the first and the third light-emitting layers, the emission wavelength of the second light-emitting layer is longer than that of the first and third light-emitting layers, and the host material of the first and third light-emitting layer are different. The white organic light-emitting device of the present invention is capable of effectively increasing the luminous efficiency, reducing operating voltage, and providing color stability.

19 Claims, 1 Drawing Sheet

WHITE ORGANIC LIGHT-EMITTING DEVICE

BACKGROUND OF THE INVENTION

1. Field of the Invention

The present invention relates to organic light-emitting devices, and more particularly, to a white organic light-emitting device capable of effectively increasing the luminous efficiency, lowering operating voltages, and providing color stability.

2. Description of Related Art

Light-emitting layer of phosphorescent organic light-emitting devices generally achieves goals likes increasing luminous efficiency and adjusting photochromes by doping guest dopant with high quantum efficiency into host. Usually, the guest dopant is composed of organic complexes having transition metals.

To develop highly efficient blue PHOLEDs, a large triplet excited state of >2.7 eV for the host material is essential in order to prevent quenching of the dopant emission. (see Ref. Appl. Phys. Lett., 83, 569 (2003)) However, host materials that have large triplet excited state, in general, have wider bandgap which acts as energy barriers for the transport of carriers from nearby hole or electron-transporting layer to phosphorescent emitter. Consequently, blue PHOLEDs tend to have higher driving voltage (>6 V) and lower power efficiency (<10 lm/W).

Fabrication of white organic light-emitting devices can be achieved by admixing more than two guest dopants with different emission wavelength (such as blue/yellow, blue/red or blue/green/red) in a single host material, and then adjusting respective concentrations of the guest dopant to generate white-light. However, this method has the drawback in the difficulty in controlling concentrations of respective host materials, which is adverse to fabrication.

Therefore, two or more light-emitting layers with different photochromes are typically used in the industry for fabrication of a white organic light-emitting device, wherein a blue light-emitting layer is essential in the fabrication. Nevertheless, in the context of a device having a light-emitting multilayer, when different operating voltages are applied, the color is changed due to the shift of carrier recombination zone. To solve the above-mentioned problems, TW I279165 and US 2007/0035240 disclose a blue light-emitting layer that is disposed between two red light-emitting layers, wherein the two red light-emitting layers include the same host material, guest dopant and thickness of the layers, so as to suppress color deviation. JP 2007/335214 discloses an organic light-emitting device in which a light-emitting layer with a long emission wavelength (yellow or red) is disposed between two light-emitting layers with short emission wavelength (blue or green), wherein the compositions of the two light-emitting layers with short emission wavelength are the same. JP 2007/189002 discloses an organic light-emitting device in which a yellow/red light-emitting layer is disposed between two blue light-emitting layers, wherein the two blue light-emitting layers include different guest materials, and the guest materials are defined, respectively, as "a material having an emission wavelength ranging from 430 to 465 nm" and "a material having an emission wavelength ranging from 465 to 485 nm."

However, when a white organic light-emitting device comprises a light-emitting multilayer in which layers are composed of the same host material, a barrier for transport or injection of charge carriers between adjacent hole transport layer and/or electron transport layer is generated, thereby causing problems of high operating voltage and low luminous efficiency as described above.

SUMMARY OF THE INVENTION

The present invention provides a white organic light-emitting device, comprising: an anode; a hole transport layer formed on the anode; a first light-emitting layer formed on the hole transport layer, and the first light-emitting layer comprising a first host material, a first transition metal organic complex and a carrier transport material; a second light-emitting layer formed on the first light-emitting layer, so as to allow the first light-emitting layer to be disposed between the hole transport layer and the second light-emitting layer, and the second light-emitting layer comprising a second transition metal organic complex; a third light-emitting layer formed on the second light-emitting layer, so as to allow the second light-emitting layer to be disposed between the first light-emitting layer and the third light-emitting layer, and the third light-emitting layer comprising a third host material, the first transition metal organic complex and a carrier transport material; and an electron transport layer formed on the third light-emitting layer, so as to allow the third light-emitting layer to be disposed between the second light-emitting layer and the electron transport layer; and a cathode formed on the outer surface of the electron transport layer, wherein the emission wavelength of second light-emitting layer is longer than the emission wavelength of the first light-emitting layer and the third light-emitting layer, and the first host material and the third host material are different materials (hereinafter, the first light-emitting layer is sometimes abbreviated as "B1 layer", the second light-emitting layer is sometimes abbreviated as "Y1 layer", and the third light-emitting layer is sometimes abbreviated as "B2 layer").

In the white organic light-emitting device of the present invention, in the context of the photochrome or wavelength emitted from each of the layers, a transition metal organic complex can be selected as a material to make Y1 layer emit yellow, red or orange lights, and another transition metal organic complex can be selected as a material to make B1 and B2 layers emit blue or green light. In an aspect, the emission wavelength of Y1 layer ranges from 520 nm to 640 nm, and the emission wavelength of B1 and/or B2 layers range from 400 nm to 480 nm.

In the present invention, B1 and B2 layers comprise different host materials, but the same guest material (i.e., the first transition metal organic complex). Y1 layer is disposed between B1 and B2 layers, and Y1 may further comprise a second host material that is the same as the host material of B1 or B2 layer.

In an aspect, the second light-emitting layer may comprise a carrier transport material.

In another aspect, the white organic light-emitting device of the present invention further comprises a fourth light-emitting layer disposed between the first light-emitting layer and the third light-emitting layer, and the fourth light-emitting layer comprises a fourth host material and a second transition metal organic complex (hereinafter, the fourth light-emitting layer is sometimes abbreviated as Y2 layer). Among the layers, the emission wavelength of Y2 is longer than that of B1 and B2 layers, and the emission wavelength of Y2 layer may generate yellow, red or orange lights. In an aspect, the emission wavelength of Y2 layer ranges from 520 nm to 640 nm.

In a further aspect, the fourth light-emitting layer may comprise the carrier transport material.

In the fourth light-emitting layer, the fourth host material and one of the first host material and the third host material are the same, and the fourth host material and the second host material are different. An example of an arrangement and composition of the layers is as follows, but is not limited thereto. When the light-emitting layers of the white organic light-emitting device of the present invention are disposed in the arrangement of B1-Y1-Y2-B2 layers, B1 and Y1 layers can comprise the same host material, and B2 and Y2 layers can comprise the same host material, wherein the host material of B1 and B2 layers are different.

In a further aspect, the white organic light-emitting device of the present invention further comprises an electron blocking layer (EBL) disposed between the hole transport layer and the first light-emitting layer.

In yet another aspect, the white organic light-emitting device of the present invention further comprises a hole blocking layer (HBL) disposed between the electron transport layer and the third light-emitting layer.

In the present invention, the triplet excited state of the carrier transport material and the first and third host materials are all higher than that of the first transition metal organic complex. The triplet excited state of the carrier transport material and the second host material are all higher than that of the second transition metal organic complex.

The white organic light-emitting device of the present invention is capable of providing white light having color stability, so as to lower operating voltage and significantly improving device performance. Further, the components of the device of the present invention allow processes to be performed more conveniently.

Moreover, the white organic light-emitting device of the present invention has features like using flat lighting source, mercury-free and non-UV light, and having high color rendering. Hence, the white organic light-emitting device of the present invention is applicable to lighting equipments (such as interior lighting equipments) and decorative light sources.

The detailed description of the present invention is illustrated by using specific preferred embodiments below. Persons having ordinary skills in the art can conceive the other advantages and effects of the present invention in light of the disclosure of the specification of the present invention.

DETAILED DESCRIPTION OF THE PREFERRED EMBODIMENTS

Features of the present invention are further illustrated by the specific preferred embodiments below, but the preferred embodiments are not intended to limit the scope of the present invention.

Figure 1:
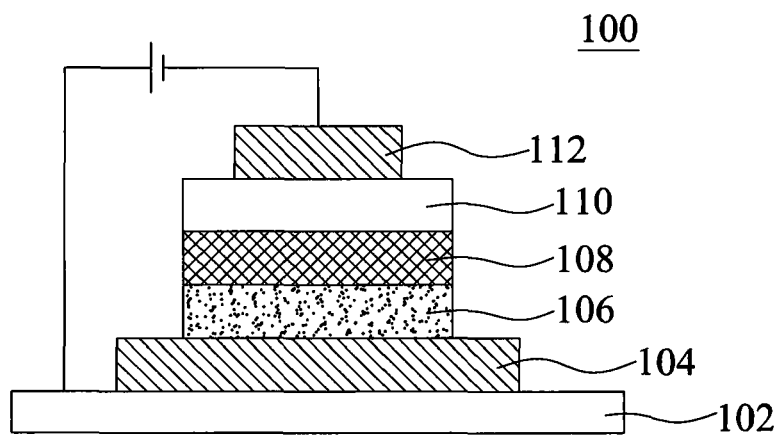
FIG. 1 is a schematic diagram of a cross-sectional structure of a white organic light-emitting device according to an embodiment of the present invention.

FIG. 1 is a schematic diagram of a cross-sectional structure of a white organic light-emitting device according to an embodiment of the present invention. In an embodiment, a white organic light-emitting device 100 comprises the followings in an order from bottom to top: a substrate 102, an anode 104, a hole transport layer 106, an organic light-emitting layer 108, an electron transport layer 110 and a cathode 112. In a preferred embodiment, the substrate 102 and anode 104 are both made from transparent materials. Examples of the substrate 102 include glass substrate and plastic substrate, but are not limited thereto, and a light-emitting device fabricated from plastic substrate has the advantage of being flexible. Examples of the anode 104 include transparent, conductive metal oxide films such as indium tin oxide (ITO), but are not limited thereto.

An example of the material of the hole transport layer 106 include N,N'-bis-(1-naphthyl)-N,N'-diphenyl, 1,1'-biphenyl-4,4'-diamine (NPB).

Figure 2:
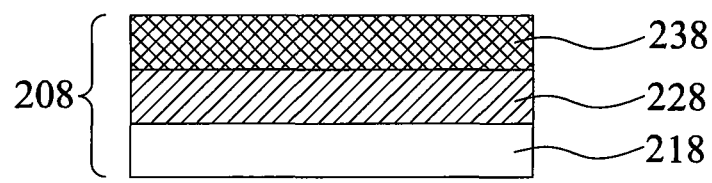
FIG. 2 is a schematic diagram of a structure of the organic light-emitting layers for use in the white organic light-emitting device of the present invention.

FIG. 2 is a schematic diagram of an organic layer 208 of the present invention. The organic layer 208 comprises a first light-emitting layer (B1 layer) 218, a second light-emitting layer (Y1 layer) 228 formed on the first light-emitting layer 218, and a third light-emitting layer (B2 layer) 238 formed on the second light-emitting layer 228. Among the layers, the first light-emitting layer 218 is in contact with or close to a hole transport layer, and the third light-emitting layer 238 is in contact with or close to an electron transport layer. More specifically, the first light-emitting layer 218 and the third light-emitting layer 238 are light-emitting layers that emit short emission wavelength, and are preferably blue light-emitting layers; whereas the second light-emitting layer 228 is a light-emitting layer that emits a long emission wavelength, and is preferably a yellow or red light-emitting layer.

Figure 3:
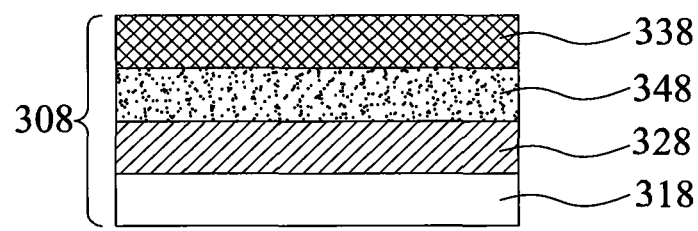
FIG. 3 is a schematic diagram of another structure of the organic light-emitting layers for use in the white organic light-emitting device of the present invention.

FIG. 3 is a schematic diagram of another organic light-emitting layer 308 of the present invention. The organic light-emitting layer 308 comprises a first light-emitting layer (B1 layer) 318, a second light-emitting layer (Y1 layer) 328 formed on the first light-emitting layer 318, a fourth light-emitting layer (Y2 layer) 348 formed on the second light-emitting layer 328, and a third light-emitting layer (B2 layer) 338 formed on the fourth light-emitting layer 328. Among the layers, the first light-emitting layer 318 is in contact with or close to a hole transport layer, and the third light-emitting layer 338 is in contact with or close to the electron transport layer. More specifically, the first light-emitting layer 318 and the third light-emitting layer 338 are light-emitting layers that emit short emission wavelength, and are preferably blue light-emitting layers; whereas the second light-emitting layer 328 and the fourth light-emitting layer 348 disposed between the two above layers are light-emitting layers that emit long emission wavelengths, and are preferably a yellow or red light-emitting layer.

In an aspect, the first light-emitting layer comprise a first host material, a first transition metal organic complex and a carrier transport material, the second light-emitting layer comprises a second host material and a second transition metal organic complex, and the third light-emitting layer comprises a third host material, a first transitional metal organic complex and a carrier transport material, wherein the triplet excited state of the first host material, the third host material and the carrier transport material are all higher than that of the first transition metal organic complex. In a preferred embodiment, the triplet excited state of the first host material and the third host material are higher than 2.7 eV.

In a preferred embodiment, the first light-emitting layer is disposed between the anode and the second light-emitting layer, and the third light-emitting layer is disposed between the second light-emitting layer and the cathode.

In a preferred embodiment of the present invention, the first host material and the third host material are different, and the second host material and one of the first host material and the third host material are the same.

In a preferred embodiment, the first host material is one selected from a carbazole-based compound and an aromatic compound containing tertiary amine. Preferably, one or more host materials can be selected. Specifically, the first host material is one selected from the group consisting of 9-(4-t-butylphenyl)-3,6-bis(triphenylsilyl)-9H-carbazole (CzSi), 2,2'-bis(4-carbazolylphenyl)-1,1'-biphenyl (4CzPBP), 4,4'-bis(9-carbazolyl)-2,2'-dimethyl-biphenyl (CDBP), 2,5-benzene-N,N'-dicarbozolyl (mCP), 3,5-bis(9-carbazolyl)tetraphenylsilane (SimCP), tri[4-(9-phenylfluoro-9-yl)phenyl]amine (TFTPA), 4,4',4'-tri(N-carbazolyl)triphenylamine (TCTA), bis[4-(p,p'-dimethyldianilino)-phenyl]diphenylsilane (DTASi), 1,1-bis[4-N,N-di(p-tolyl)amino]phenyl]cyclohexane (TAPC) and a combination thereof.

In another preferred embodiment of the present invention, the third host material can be one selected from a phosphine oxide-based compound, a triazine compound and an imidazole compound. Preferably, one or more third host materials may be selected for the third light-emitting layer. Specifically, the third host material can be one selected from the group consisting of 2,8-bis(diphenylphosphino)dibenzofuran (DP-DBF), 2,8-bis(diphenylphosphino)dibenzothiophene (PTT), 2,4,6-carbazolo-1,3,5-triazine (TRZ), 1,3,5-tri(phenylbenzomidazol-2-yl)benzene (TPBI) and a combination thereof.

In the organic light-emitting device of the present invention, the first light-emitting layer and the third light-emitting layer comprise the first transition metal organic complex.

In a preferred embodiment, the first transition metal organic complex is one that can generate blue light, and is independently selected from the followings: iridium(III) bis(4,6-difluorophenyl)-pyridinato-N,C²)picolate (FIrpic), iridium(III) bis(4',6'-difluorophenylpyridinato)tetrakis(1-pyrazolyl)borate (FIr6), iridium(III) bis(4,6-difluorophenylpyridinato)(3-(trifluoromethyl)-5-(pyridin-2-yl)-1,2,4-triazolate (FIrtaz), iridium(III) bis(4,6-difluorophenylpyridinato)(5-pyridyl-2-yl)-1H-tetrazolate (FIrN4), etc.

In the organic light-emitting device of the present invention, the second light-emitting layer and the optional four light-emitting layer comprise the second transition organic complex that can generate yellow or red lights. In a preferred embodiment, the second transition metal organic complex can be selected from one of iridium(III) bis-(2-phenylquinolyl-N,C²')acetylacetonate (PQIr) and PO-01 represented by the following structure.

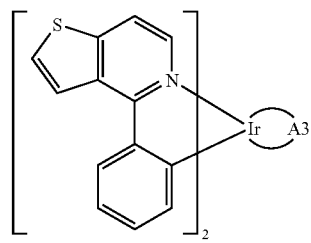

In a preferred embodiment, the carrier transport material can be an aromatic compound containing tertiary amine, and is selected from one represented by formulae (I) and (II):

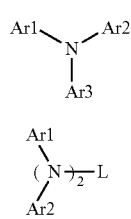

wherein Ar1, Ar2 and Ar3 are independently selected from $C_6$-$C_{10}$ aryl group and $C_6$-$C_{10}$ aryl group substituted by 1 to 3 substituents, wherein the substituents are selected from the followings: $C_1$-$C_6$ alkyl group, $C_1$-$C_6$ alkoxy group, $C_1$-$C_6$ alkylamino group, N-carbazolyl group and 9-phenylfluorene-9-yl; and L is independently selected from a single covalent bond, $C_3$-$C_{10}$ cycloalkyl group, silica, mono- or di-phenylsilyl.

Preferably, the carrier transport material can be one selected from the group consisting of tris[4-(9-phenylfluoren-9-yl)phenyl]amine (TFTPA), 4,4',4'-tris(N-carbazolyl)triphenylamine (TCTA), bis[4-(p,p'-dimethyldianilino)-phenyl]diphenylsilane (DTASi) 1,1-bis[4-[N,N-di(p-tolyl)amino]phenyl]cyclohexane (TAPC) and a combination thereof.

The following chemical formulae and Table 1 exemplify the host materials, carrier transport material and phosphorescent materials employed in the embodiments of the present invention.

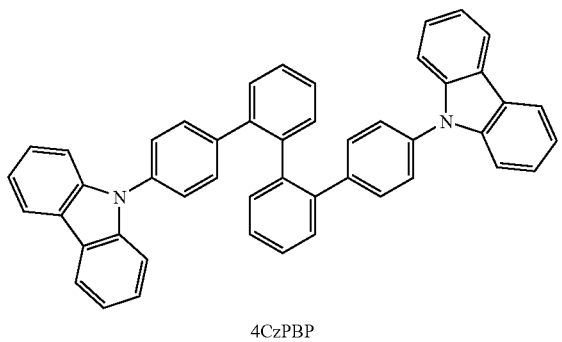 [SMILES: c1ccc(-c2ccccc2-c2ccc(-n3c4ccccc4c4ccccc43)cc2)c(-c2ccc(-n3c4ccccc4c4ccccc43)cc2)c1]

4CzPBP

The first host material

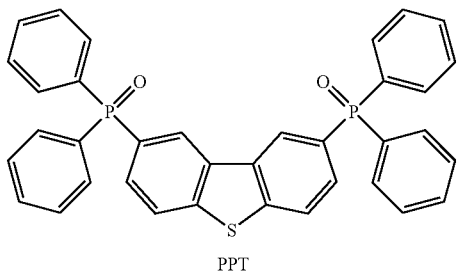

PPT

The second host material

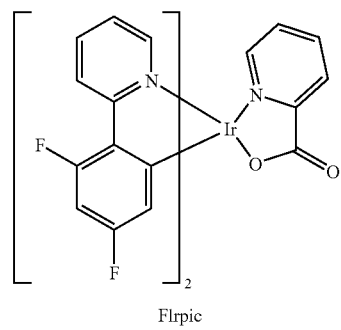

FIrpic

The first transition metal organic complex

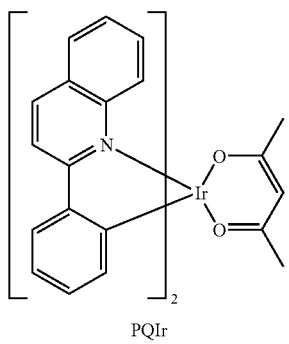
PQIr

The second transition metal organic complex

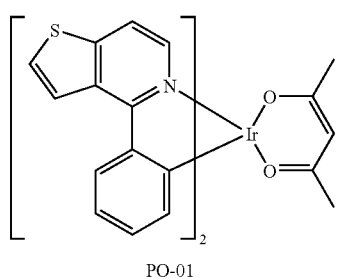
PO-01

The second transition metal organic complex

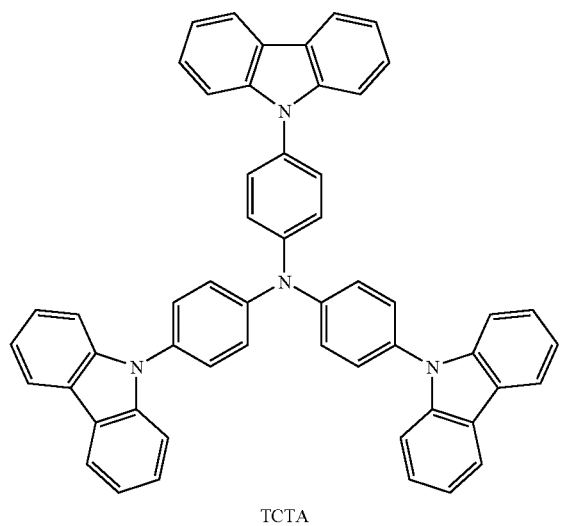 [SMILES: c1ccc2c(c1)c1ccccc1n2-c1ccc(N(c2ccc(-n3c4ccccc4c4ccccc43)cc2)c2ccc(-n3c4ccccc4c4ccccc43)cc2)cc1]
TCTA

The carrier transport material

TABLE 1

| Compound | HOMO (eV) | LUMO (eV) | Triplet Excited State (eV) |
|---|---|---|---|
| 4CzPBP | 6.1 | 2.6 | 2.8 |
| PPT | 6.6 | 2.9 | 3.1 |
| DTASi | 5.6 | 2.3 | 3.0 |
| Bphen | 6.4 | 3.0 | 2.5 |
| FIrpic | 5.8 | 2.9 | 2.7 |
| TCTA | 5.9 | 2.7 | 2.9 |

Referring to FIG. 1, when a voltage is externally applied to the white organic light-emitting device of the present invention, electrons and holes are transported to the organic light-emitting layer 108 via the electron transport layer 110 and the hole transport layer 106, and then the electrons and holes combine in the organic light-emitting layer 108 to emit light. At this time, the triplet excited state of the host material and the carrier transport material are respectively higher than that of the transition metal organic complex, therefore the operating voltages required by the device is lower and the luminous efficiency of the device is increased.

The followings illustrate each of the embodiments of the white organic light-emitting device of the present invention, but the type, thickness and concentration of the materials used for each of the layers are not intended to limit the scope of the present invention.

Example 1

In Example 1, B1, B2, Y1 and Y2 comprised the following components:

B1: a host material (4CzPBP), a first transition metal organic complex (FIrpic) and a carrier transport material (TCTA) at a weight ratio of 75:15:10.

Y1: a host material (4CzPBP), a second transition metal complex (PO-01) and a carrier transport material (TCTA) at a weight ratio of 85:5:10.

Y2: a host material (PPT), a second transition metal complex (PO-01) and a carrier transport material (TCTA) at a weight ratio of 85:5:10.

B2: a host material (PPT), a first transition metal organic complex (FIrpic) and a carrier transport material (TCTA) at a weight ratio of 75:15:10.

The white organic light-emitting device of the present invention was fabricated according to the following procedure.

In the example, 150 nm-thick ITO was formed on a 0.7 mm-thick glass substrate as an anode. NPB having a thickness of 10 nm was coated on the anode to form a hole transport layer by thermal evaporation, and then 20 nm-thick DTASi was coated on the hole transport layer to form an electron blocking layer by thermal evaporation. FIrpic, 4CzPBP and TCTA were co-evaporated on the electron blocking layer to form a first light-emitting layer (i.e., B1 layer) having a thickness of 8 nm. Subsequently, PO-01, 4CzPBP and TCTA were co-evaporated on the first light-emitting layer to form a second light-emitting layer (i.e., Y1 layer) having a thickness of 0.2 nm. Then, PPT, PO-01 and TCTA were co-evaporated on the second light-emitting layer to form a fourth light-emitting layer (i.e., Y2 layer) having a thickness of 0.2 nm. Then, PPT, FIrpic and TCTA were co-evaporated on the fourth light-emitting layer to form a third light-emitting layer (i.e., B2 layer) having a thickness of 8 nm.

Next, 4,7-diphenyl-1,10-phenanthroline (hereinafter, abbreviated as "Bphen") having a thickness of 25 nm was coated on the third light-emitting layer to form an electron transport layer by thermal evaporation. Then, cesium carbonate ($Cs_2CO_3$) and Bphen were co-evaporated on the electron transport layer at a ratio of 20:80 to form an electron injection layer having a thickness of 20 nm. Afterwards, a 100 nm-thick aluminum cathode was formed on the electron injection layer by thermal evaporation.

In the example, a light-emitting multilayer B1-Y1-Y2-B2 was composed of four layers that emitted lights in the order of blue-yellow-yellow-blue lights, and each of the layers contained a carrier transport material. Test results of the current efficiency and operating voltages of the device at luminance of 1000 cd/m² and the color coordinates of white light of the device are shown in Table 2.

Example 2

In Example 2, B1, B2, Y1 and Y2 comprised the following components:
B1: a host material (4CzPBP), a first transition metal organic complex (FIrpic) and a carrier transport material (TCTA) at a weight ratio of 75:15:10.
Y1: a host material (4CzPBP) and a second transition metal complex (PO-01) at a weight ratio of 95:5.
Y2: a host material (PPT) and a second transition metal complex (PO-01) at a weight ratio of 95:5.
B2: a host material (PPT), a first transition metal organic complex (FIrpic) and a carrier transport material (TCTA) at a weight ratio of 75:15:10.
Moreover, the white organic light-emitting device in Example 2 was fabricated according to the procedure in Example 1.
In the example, a light-emitting multilayer B1-Y1-Y2-B2 was composed of four layers that emitted lights in the order of blue-yellow-yellow-blue lights, and Y1 and Y2 layers did not contain carrier transport materials. Test results of the current efficiency and operating voltages of the device at luminance of 1000 cd/m² and the color coordinates of white light of the device are shown in Table 2.

Example 3

In Example 3, B1, B2, and Y1 comprised the following components:
B1: a host material (4CzPBP), a first transition metal organic complex (FIrpic) and a carrier transport material (TCTA) at a weight ratio of 75:15:10.
Y1: a second transition metal complex.
B2: a host material (PPT), a first transition metal organic complex (FIrpic) and a carrier transport material (TCTA) at a weight ratio of 75:15:10.
Moreover, the white organic light-emitting device in example 3 was fabricated according to the procedure in example 1, wherein the thickness of Y1 layer was 0.1 nm. In the example, a light-emitting multilayer B1-Y1-B2 was composed of three layers that emitted lights in the order of blue-yellow-blue lights. Test results of the current efficiency and operating voltages of the device at luminance of 1000 cd/m² and the color coordinates of white light of the device are shown in Table 2.

Comparative Example 1

In Comparative Example 1, B1, B2, Y1 and Y2 comprised the following components:
B1: a host material (4CzPBP), a first transition metal organic complex (FIrpic) and at a weight ratio of 85:15.
Y1: a host material (4CzPBP) and a second transition metal complex (PO-01) at a weight ratio of 95:5.
Y2: a host material (PPT) and a second transition metal complex (PO-01) at a weight ratio of 95:5.
B2: a host material (PPT) and a first transition metal organic complex (FIrpic) were at a weight ratio of 85:15.
Moreover, the white organic light-emitting device in comparative Example 1 was fabricated according to the procedure in Example 1. In the comparative example, a light-emitting multilayer B1-Y1-Y2-B2 was composed of four layers that emitted lights in the order of blue-yellow-yellow-blue lights. Test results of the current efficiency and operating voltages of the device at luminance of 1000 cd/m² and the color coordinates of white light of the device are shown in Table 2.

Comparative Example 2

In Comparative Example 2, B1, B2 and Y1 comprised the following components:
B1: a host material (4CzPBP) and a first transition metal organic complex (FIrpic) at a weight ratio of 85:15.
Y1: a host material (4CzPBP) and a second transition metal complex (PO-01) at a weight ratio of 95:5.
B2: a host material (PPT) and a first transition metal organic complex (FIrpic) at a weight ratio of 85:15.
The white organic light-emitting device of the present invention was fabricated according to the following process.
In the comparative example, 150 nm-thick ITO was formed on a 0.7 mm-thick glass substrate as an anode. NPB having a thickness of 10 nm was coated on the anode to form a hole transport layer by thermal evaporation, and then 20 nm-thick DTASi was coated on the hole transport layer to form an electron blocking layer by thermal evaporation. FIrpic and 4CzPBP were co-evaporated on the electron blocking layer to form a first light-emitting layer (i.e., B1 layer) having a thickness of 8 nm. Subsequently, PO-01 and 4CzPBP were co-evaporated on the first light-emitting layer to form a second light-emitting layer (i.e., Y1 layer) having a thickness of 0.2 nm. Then, 4CzPBP and FIrpic were co-evaporated on the second light-emitting layer to form a third light-emitting layer (i.e., B2 layer) having a thickness of 8 nm.
Next, 25 nm-thick Bphen was coated on the third light-emitting layer to form an electron transport layer by thermal evaporation. Then, cesium carbonate ($Cs_2CO_3$) and Bphen were co-evaporated on the electron transport layer at a ratio of 20:80 to form an electron injection layer having a thickness of 20 nm. Afterwards, a 100 nm-thick aluminum cathode was formed on the electron injection layer by thermal evaporation.
In the comparative example, a light-emitting multilayer B1-Y1-B2 was composed of three layers that emitted lights in the order of blue-yellow-blue lights. Test results of the current efficiency and operating voltages of the device at luminance of 1000 cd/m² and the color coordinates of white light of the device are shown in Table 2.

Comparative Example 3

In Comparative Example 3, B1 and Y1 comprised the following components:
B1: a host material (4CzPBP), a first transition metal organic complex (FIrpic) and a carrier transport material (TCTA) at a weight ratio of 75:15:10.
Y1: a host material (4CzPBP) and a second transition metal complex (PO-01) at a weight ratio of 95:5.
The white organic light-emitting device of the present invention was fabricated according to the following process.
In the comparative example, 150 nm-thick ITO was formed on a 0.7 mm-thick glass substrate as an anode. NPB having a thickness of 10 mm was coated on the cathode to form a hole transport layer by thermal evaporation, and then 20 nm-thick DTASi was coated on the hole transport layer to form an electron blocking layer by thermal evaporation. PO-01 and 4CzPBP were co-evaporated on the electron blocking layer to form a second light-emitting layer (i.e., Y1 layer) having a thickness of 12 nm. Then, FIrpic and 4CzPBP were co-evaporated on the first light-emitting layer to form a first light-emitting layer (i.e., B1 layer) having a thickness of 8 nm. Subsequently, 25 nm-thick Bphen was coated to form an electron transport layer by thermal compression. Then, cesium carbonate ($Cs_2CO_3$) and Bphen were co-evaporated on the electron transport layer at a ratio of 20:80 to form an electron injection layer having a thickness of 20 nm. Afterwards, a 100 nm-thick aluminum cathode was formed on the electron injection layer by thermal evaporation.

In the comparative example, a light-emitting multilayer Y1-B1 was composed of two layers that emitted lights in the order of yellow-blue lights. Test results of the current efficiency and operating voltages of the device at luminance of 1000 $cd/m^2$ and the color coordinates of white light of the device are shown in Table 2.

TABLE 2

| Example | Device at luminance of 1000 cd/m2 | | |
|---|---|---|---|
| | Operating voltage (V) | Current efficiency (cd/A) | Color coordinate |
| Example 1 | 4.0 | 40 | (0.36, 0.47) |
| Example 2 | 4.0 | 38 | (0.34, 0.46) |
| Example 3 | 4.0 | 40.3 | (0.34, 0.45) |
| Comparative Example 1 | 4.6 | 28 | (0.34, 0.44) |
| Comparative Example 2 | 4.6 | 28 | (0.30, 0.44) |
| Comparative Example 3 | 4.6 | 27 | (0.34, 0.41) |

The standard color coordinates (x,y) of white light, set by the Commission International de l'Eclairage (CIE), are (0.33, 0.33), but white light further comprises different color temperatures (such as cool white, daylight white, warm white, etc.). Thus, the CIE value of white light has relatively greater variation compared with those of the other lights.

According to the results shown in Table 2, as compared with comparative example 1, the devices in Example 1 and Example 2 (i.e., the examples in which B1 and B2 layer had carrier transport material) of the present invention effectively lowered the operating voltages to up to 16% and increased the device efficiency to about 36 to 43% due to the presence of carrier transport material in blue light-emitting layers. In other words, as compared with Comparative Example 2, the devices in Example 1 and Example 2 of the present invention can effectively lower operating voltages and increasing the device efficiency when the two blue light-emitting layers are formed by different host materials. Further, the device in Example 3 of the present invention can still maintain high luminous efficiency and low operating voltages when a yellow light-emitting layer is formed from a single transition metal organic complex.

In conclusion, the white organic light-emitting device of the present invention can decrease the operating voltage and substantially increase the device efficiency thereof, and provide white light with stable chromaticity.

The invention has been described using exemplary preferred embodiments. However, it is to be understood that the scope of the invention is not limited to the disclosed arrangements. The scope of the claims, therefore, should be accorded the broadest interpretation, so as to encompass all such modifications and similar arrangements.

The invention claimed is:
1. A white organic light-emitting device, comprising:
an anode;
a hole transport layer formed on the anode;
a first light-emitting layer formed on the hole transport layer, the first light-emitting layer comprising a first host material, a first transition metal organic complex and a carrier transport material;
a second light-emitting layer formed on the first light-emitting layer, so as to allow the first light-emitting layer to be disposed between the hole transport layer and the second light-emitting layer, and the second light-emitting layer comprising a second transition metal organic complex;
a third light-emitting layer formed on the second light-emitting layer, so as to allow the second light-emitting layer to be disposed between the first light-emitting layer and the third light-emitting layer, the third light-emitting layer comprising a third host material, the first transition metal organic complex and the carrier transport material;
an electron transport layer formed on the third light-emitting layer, so as to allow the third light-emitting layer to be disposed between the second light-emitting layer and the electron transport layer; and
a cathode formed on an outer surface of the electron transport layer,
wherein the emission wavelength of the second light-emitting layer is longer than that of the first light-emitting layer and third light-emitting layer, and the first host material is different from the third host material,
wherein the carrier transport material is one selected from one represented by formulae (I) and (II):

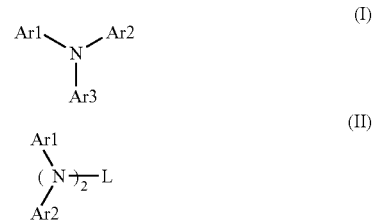

wherein Ar1, Ar2 and Ar3 are independently selected from $C_6$-$C_{10}$ aryl group or $C_6$-$C_{10}$ aryl group substituted by 1 to 3 substituents, wherein the substituents are independently selected from $C_1$-$C_6$ alkyl group, $C_1$-$C_6$ alkoxy group, $C_1$-$C_6$ alkylamino group, N-carbazolyl group or 9-phenylfluorene-9-yl; and
L is independenty selected from a single covalent bond, $C_3$-$C_{10}$ cycloalkyl group, silica, or mono- or di-phenyl-silyl.

2. The device of claim 1, wherein the second light-emitting layer further comprises a second host material.

3. The device platform of claim 2, wherein the second light-emitting layer further comprises a carrier transport material.

4. The device of claim 2, wherein the second host material are the same as either the first host material or the third host material.

5. The device of claim 1, wherein the emission wavelength of the first light-emitting layer and the third light-emitting layer range from 400 nm to 480 nm.

6. The device of claim 5, wherein the emission wavelength of the second light-emitting layer ranges from 520 nm to 640 nm.

7. The device of claim 6, further comprising a fourth light-emitting layer formed between the first light-emitting layer and the third light-emitting layer, the fourth light-emitting layer comprising a fourth host material and the second transition metal organic complex, and an emission wavelength of the fourth light-emitting layer is longer than that of the first light-emitting layer and the third light-emitting layer.

8. The device of claim 7, wherein the fourth light-emitting layer further comprises a carrier transport material.

9. The device of claim 7, wherein the fourth host material is same as either the first host material or the third host material, and the fourth host material are different from the second host material.

10. The device of claim 1, wherein triplet excited state of the carrier transport material, the first host material and the third host material are higher than that of the first transition metal organic complex.

11. The device of claim 3, wherein triplet excited state of the carrier transport material and the second host material are higher than that of the second transition metal organic complex.

12. The device of claim 1, wherein the carrier transport material is at least one selected from the group consisting of tris[4-(9-phenylfluoren-9-yl)phenyl]amine, 4,4'4'-tris(N-carbazolyl)triphenylamine, bis[4-(p,p'-dimethyldianilino)-phenyl]diphenylsilane, 1,1-bis[4-[N,N-di(p-tolyl)amino]phenyl]cyclohexane and a combination thereof.

13. The device of claim 1, wherein the first host material is selected from one of a carbazole-based compound and an aromatic compound containing tertiary amine.

14. The device of claim 1, wherein the first host material is at least one selected from the group consisting of 9-(4-t-butylphenyl)-3,6-bis(triphenylsilyl)-9H-carbazole, 2,2'-bis(4-carbazolylphenyl)-1,1'-biphenyl, 4,4'-bis(9-carbazolyl)-2,2'-dimethyl-biphenyl, N,N'-dicarbozolyl-2,5-benzene, 3,5-bis(9-carbazolyl)tetraphenylsilane, tri[4-(9-phenylfluoro-9-yl)phenyl]amine, 4,4',4'-tri(N-carbazolyl)triphenylamine, bis [4-(p,p '-dimethyldianilino)-phenyl]diphenylsilane, 1,1-bis[4-N,N-di(p-tolyl)amino]phenyl]cyclohexane and a combination thereof.

15. The device of claim 1, wherein the third host material is selected from one of a phosphine oxide-based compound and a triazine compound and an imidazole compound.

16. The device of claim 15, wherein the third host material is at least one selected from the group consisting of 2,8-bis(diphenylphosphino)dibenzofuran, 2,8-bis(diphenylphosphino)dibenzothiophene, 2,4,6-carbazolo-1,3,5-triazine, 1,3,5-tri(phenylbenzomidazol-2-yl)benzene and a combination thereof.

17. The device of claim 1, wherein the first transition metal organic complex is independently selected from iridium(III) bis(4,6-difluorophenyl)-pyridinato-N,$C^2$)picolate (FIrpic), iridium(III) bis(4',6'-difluorophenylpyridinato)tetrakis(1-pyrazoly)borate (FIr6), iridium(III) bis(4,6-difluorophenylpyridinato)(3-(trifluoromethyl)-5(pyridine-2-yl)-1,2,4-triazolate (FIrtaz), and iridium(III) bis(4,6-difluophenylpyridinato-N,$C^{2'}$)[5-(pridyl-2-yl)-1H-tetrazolate (FIrN4).

18. The device of claim 1, wherein the second transition metal organic complex is one selected from iridium(III) bis (2-phenylquinolyl-N,$C^{2'}$)(acetylacetonate) (PQIr) and PO-01.

19. The device of claim 7, wherein the second transition metal organic complex is one selected from iridium(III) bis (2-phenylquinolyl-N,$C^{2'}$)(acetylac) (PQIr) and PO-01.

* * * * *